United States Patent
Reid et al.

(10) Patent No.: US 10,244,634 B2
(45) Date of Patent: *Mar. 26, 2019

(54) METHOD AND APPARATUS FOR AUTOMATICALLY ADJUSTING DISPENSING UNITS OF A DISPENSER

(71) Applicant: Illinois Tool Works Inc., Glenview, IL (US)

(72) Inventors: Scott A. Reid, Bradford, MA (US); Hugh R. Read, Amesbury, MA (US); Thomas C. Prentice, Westford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/890,016

(22) Filed: Feb. 6, 2018

(65) Prior Publication Data

US 2018/0160542 A1 Jun. 7, 2018

Related U.S. Application Data

(60) Continuation of application No. 15/628,987, filed on Jun. 21, 2017, now Pat. No. 9,936,585, which is a
(Continued)

(51) Int. Cl.
*B05C 5/02* (2006.01)
*H05K 3/00* (2006.01)
(Continued)

(52) U.S. Cl.
CPC ......... *H05K 3/0085* (2013.01); *H05K 3/4644* (2013.01); *H05K 13/0469* (2013.01);
(Continued)

(58) Field of Classification Search
None
See application file for complete search history.

(56) References Cited

U.S. PATENT DOCUMENTS

| 4,872,417 A | 10/1989 | Kuwabara et al. |
| 5,044,900 A | 9/1991 | Cavallaro |

(Continued)

FOREIGN PATENT DOCUMENTS

| CN | 1838997 A | 9/2006 |
| CN | 101204890 A | 6/2008 |

(Continued)

OTHER PUBLICATIONS

English translation for JP 200972648 (2009).*
(Continued)

*Primary Examiner* — Charles Capozzi
(74) *Attorney, Agent, or Firm* — Lando & Anastasi, LLP

(57) ABSTRACT

A dispensing apparatus includes a frame having a gantry configured to provide movement in the X axis and Y axis directions, and first and second dispensing units coupled to the gantry and configured to dispense material onto a substrate. The second dispensing unit is coupled to the gantry by an automatic adjustment mechanism. The dispensing apparatus further includes a controller configured to control the operation of the gantry, the first dispenser, the second dispenser, and the automatic adjustment mechanism. The automatic adjustment mechanism is configured to move the second dispenser in the X axis and Y axis directions to manipulate a spacing between the first dispensing unit and the second dispensing. Methods of dispensing material on the substrate are further disclosed.

11 Claims, 5 Drawing Sheets

Related U.S. Application Data continuation of application No. 15/165,120, filed on May 26, 2016, now Pat. No. 9,775,250, which is a division of application No. 14/041,300, filed on Sep. 30, 2013, now Pat. No. 9,374,905.

(51) Int. Cl.
| | |
|---|---|
| *H05K 3/46* | (2006.01) |
| *H05K 13/04* | (2006.01) |
| *H05K 13/08* | (2006.01) |
| *B05C 11/10* | (2006.01) |

(52) U.S. Cl.
CPC ............ *H05K 13/08* (2013.01); *B05C 5/0212* (2013.01); *B05C 11/1021* (2013.01)

(56) References Cited

U.S. PATENT DOCUMENTS

| | | | |
|---|---|---|---|
| 5,747,102 A | 5/1998 | Smith et al. | |
| 5,795,390 A | 8/1998 | Cavallaro | |
| 5,819,983 A | 10/1998 | White et al. | |
| 5,837,892 A | 11/1998 | Cavallaro et al. | |
| 5,886,494 A | 3/1999 | Prentice et al. | |
| 5,903,125 A | 5/1999 | Prentice et al. | |
| 5,918,648 A | 7/1999 | Carr et al. | |
| 5,957,343 A | 9/1999 | Cavallaro | |
| 5,971,227 A | 10/1999 | White et al. | |
| 5,985,029 A | 11/1999 | Purcell | |
| 6,007,631 A | 12/1999 | Prentice et al. | |
| 6,017,392 A | 1/2000 | Cavallaro | |
| 6,025,689 A | 2/2000 | Prentice et al. | |
| 6,056,190 A | 5/2000 | Foulke et al. | |
| 6,082,289 A | 7/2000 | Cavallaro | |
| 6,085,943 A | 7/2000 | Cavallaro et al. | |
| 6,093,251 A | 7/2000 | Carr et al. | |
| 6,112,588 A | 9/2000 | Cavallaro et al. | |
| 6,119,895 A | 9/2000 | Fugere et al. | |
| 6,157,157 A | 12/2000 | Prentice et al. | |
| 6,170,737 B1 | 1/2001 | Foulke et al. | |
| 6,206,964 B1 | 3/2001 | Purcell et al. | |
| 6,214,117 B1 | 4/2001 | Prentice et al. | |
| 6,216,917 B1 | 4/2001 | Crouch | |
| 6,224,671 B1 | 5/2001 | Cavallaro | |
| 6,224,675 B1 | 5/2001 | Prentice et al. | |
| 6,258,165 B1 | 7/2001 | Cavallaro | |
| 6,322,854 B1 | 11/2001 | Purcell et al. | |
| 6,371,339 B1 | 4/2002 | White et al. | |
| 6,378,737 B1 | 4/2002 | Cavallaro et al. | |
| 6,391,378 B1 | 5/2002 | Carr et al. | |
| 6,395,334 B1 | 5/2002 | Prentice et al. | |
| 6,412,328 B1 | 7/2002 | Cavallaro et al. | |
| 6,427,903 B1 | 8/2002 | Foulke et al. | |
| 6,444,035 B1 | 9/2002 | Nowak et al. | |
| 6,514,569 B1 | 2/2003 | Crouch | |
| 6,540,832 B2 | 4/2003 | Cavallaro | |
| 6,541,063 B1 | 4/2003 | Prentice et al. | |
| 6,641,030 B1 | 11/2003 | Freeman et al. | |
| 6,644,238 B2 | 11/2003 | Watts et al. | |
| 6,688,458 B2 | 2/2004 | Prentice et al. | |
| 6,739,483 B2 | 5/2004 | White et al. | |
| 6,775,879 B2 | 8/2004 | Bibeault et al. | |
| 6,814,810 B2 | 11/2004 | Prentice et al. | |
| 6,866,881 B2 | 3/2005 | Prentice et al. | |
| 6,902,052 B2 | 6/2005 | Prentice et al. | |
| 6,932,280 B2 | 8/2005 | Crouch | |
| 7,404,861 B2 | 7/2008 | Prentice et al. | |
| 7,524,015 B2 | 4/2009 | Srinivasan et al. | |
| 7,833,572 B2 | 11/2010 | Read | |
| 7,923,056 B2 | 4/2011 | Read | |
| 7,980,197 B2 | 7/2011 | Prentice et al. | |
| 8,136,705 B2 | 3/2012 | Tracy et al. | |
| 8,230,805 B2 | 7/2012 | Read | |
| 8,424,720 B2 | 4/2013 | Tracy et al. | |
| 9,374,905 B2 * | 6/2016 | Reid | H05K 3/0085 |
| 9,936,585 B2 * | 4/2018 | Reid | H05K 3/0085 |
| 2003/0209560 A1 | 11/2003 | Hui et al. | |
| 2005/0056215 A1 | 3/2005 | Shimoda | |
| 2006/0193969 A1 | 8/2006 | Prentice et al. | |
| 2006/0273109 A1 | 12/2006 | Keller | |
| 2006/0292291 A1 | 12/2006 | White et al. | |
| 2008/0159617 A1 | 7/2008 | Yang et al. | |
| 2008/0296311 A1 | 12/2008 | Read | |
| 2012/0240658 A1 | 9/2012 | Tracy | |
| 2012/0298038 A1 * | 11/2012 | Ikushima | B05B 12/122 118/712 |
| 2013/0133574 A1 | 5/2013 | Doyle et al. | |
| 2013/0136850 A1 | 5/2013 | Doyle et al. | |
| 2013/0177702 A1 | 7/2013 | Crouch et al. | |
| 2015/0093498 A1 | 4/2015 | Reid et al. | |

FOREIGN PATENT DOCUMENTS

| | | | |
|---|---|---|---|
| CN | 100563735 C | 12/2009 | |
| EP | 1 937 045 A1 | 6/2008 | |
| JP | 2002346452 A | 12/2002 | |
| JP | 2008 149298 A | 7/2008 | |
| JP | 2009066583 A | * 4/2009 | |
| JP | 2009066583 A | 4/2009 | |
| JP | 2009072648 A | * 4/2009 | |
| JP | 2009072648 A | 4/2009 | |
| JP | 2010199264 A | 9/2010 | |
| JP | 2011110459 A | 6/2011 | |
| KR | 100649963 B1 | 11/2006 | |
| KR | 20070041391 A | 4/2007 | |
| KR | 2010 0025290 A | 1/2010 | |
| TW | I323190 B | 4/2010 | |
| WO | 00065316 A1 | 11/2000 | |

OTHER PUBLICATIONS

English translation for JP 200966583 (2009).*
Notification of Transmittal of the International Search Report and the Written Opinion of the International Searching Authority from corresponding PCT/US2014/047499 dated Oct. 29, 2014.
Taiwan Search Report from corresponding Taiwan Patent Application No. 103127096 dated Oct. 3, 2017.
Taiwan Search Report from corresponding Taiwan Patent Application No. 106128372 dated Nov. 22, 2017.
European Search Report from corresponding European Application No. 17187642.8 dated Dec. 12, 2017.

* cited by examiner

METHOD AND APPARATUS FOR AUTOMATICALLY ADJUSTING DISPENSING UNITS OF A DISPENSER

RELATED APPLICATION

This patent application is a continuation patent application of U.S. patent application Ser. No. 15/628,987 filed on Jun. 21, 2017, entitled "METHOD AND APPARATUS FOR AUTOMATICALLY ADJUSTING DISPENSING UNITS OF A DISPENSER," which is a continuation patent application of U.S. patent application Ser. No. 15/165,120 filed on May 26, 2016, entitled "METHOD AND APPARATUS FOR AUTOMATICALLY ADJUSTING DISPENSING UNITS OF A DISPENSER," now U.S. Pat. No. 9,775,250, which is a divisional patent application of U.S. patent application Ser. No. 14/041,300 filed on Sep. 30, 2013, entitled "METHOD AND APPARATUS FOR AUTOMATICALLY ADJUSTING DISPENSING UNITS OF A DISPENSER," now U.S. Pat. No. 9,374,905, all of which are hereby incorporated by references in its entirety for all purposes.

BACKGROUND OF THE INVENTION

1. Field of the Invention

The present disclosure relates generally to methods and apparatus for dispensing a viscous material on a substrate, such as a printed circuit board, and more particularly to a method and an apparatus for dispensing material on a substrate with enhanced efficiency and accuracy.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which may be used to mechanically secure components to the circuit board. Exemplary dispensing systems described above include those manufactured and distributed by Speedline Technologies, Inc. of Franklin, Mass.

In a typical dispensing system, a pump and dispenser assembly, referred to as a dispensing head or unit, is mounted to a moving assembly or gantry for moving the pump and dispenser assembly along three mutually orthogonal axes (X, Y, Z) using servomotors controlled by a computer system or controller. To dispense a dot of liquid on a circuit board or other substrate at a desired location, the pump and dispenser assembly is moved along the co-planar horizontal X and Y axes until it is located over the desired location. The pump and dispenser assembly is then lowered along the perpendicularly oriented vertical Z axis until a nozzle/needle of the pump and dispenser assembly is at an appropriate dispensing height over the substrate. The pump and dispenser assembly dispenses a dot of liquid, is then raised along the Z axis, moved along the X and Y axes to a new location, and is lowered along the Z axis to dispense the next liquid dot. For applications such as encapsulation or underfilling as described above, the pump and dispenser assembly is typically controlled to dispense lines of material as the pump and dispenser are moved in the X and Y axes along the desired path of the lines.

The production rate of such dispensing systems, in some cases, may be limited by the rate at which a particular dispense pump assembly can accurately and controllably dispense dots or lines of material. In other cases, the production rate of such systems may be limited by the rate at which parts can be loaded into and out of the machine. In still other cases, the production rate of such systems may be limited by process requirements, such as the time required to heat a substrate to a particular temperature, or the time required for a dispensed material to flow, as in underfill applications. In all cases and applications, there is some limit to the throughput capability of a single dispense system.

During the manufacture of integrated circuits, production requirements often exceed the throughput capabilities of a single dispensing system. To overcome the throughput limitations of a single dispensing system, various strategies are applied to improve the production process. For example, U.S. Pat. Nos. 7,833,572, 7,923,056 and 8,230,805, which are incorporated herein by reference in their entirety for all purposes, are each directed to systems and methods for simultaneously dispensing material with a dispenser having multiple dispensing units. The systems and methods disclosed in these patents teach adjusting a spacing between adjacent dispensing units by using an adjustable bracket.

SUMMARY OF THE INVENTION

One aspect of the disclosure is directed to a dispensing apparatus comprising a frame including a gantry configured to provide movement in the X axis and Y axis directions, a support coupled to the frame, the support being configured to support at least one electronic substrate under the gantry, a first dispensing unit coupled to the gantry, the first dispensing unit being configured to dispense material, a second dispensing unit coupled to the gantry by an automatic adjustment mechanism, the second dispensing unit being configured to dispense material, and a controller configured to control the operation of the gantry, the first dispenser, the second dispenser, and the automatic adjustment mechanism. The automatic adjustment mechanism is configured to move the second dispenser in the X axis and Y axis directions to manipulate a spacing between the first dispensing unit and the second dispensing.

Embodiments of the dispensing apparatus further may include an imaging system coupled to one of the frame and the gantry. The imaging system may be configured to capture at least one image of a first pattern and a second pattern, the second pattern being substantially identical to the first pattern. The imaging system further may be configured to verify whether the first pattern and the second pattern are properly positioned on the support with respect to one another based on the at least one captured image to permit and configured to enable the dispensing apparatus to perform simultaneous dispense operations of the first dispensing unit on the first pattern and the second dispensing unit on the second pattern. The automatic adjustment mechanism further may include a linear bearing secured to the gantry and a mounting block, configured to ride along the linear bearing, coupled to the second dispensing unit. The automatic adjustment mechanism further may include a first linear drive motor assembly configured to move the mounting block along the linear bearing. The first linear drive motor assembly may include a ball screw driven linear actuator, which is driven by a mechanically coupled motor.

The automatic adjustment mechanism further may include a first bracket secured to the mounting block, the first bracket extending in a direction perpendicular to a direction of the linear bearing, and a second bracket secured to the second dispensing and configured to ride along the first bracket. The automatic adjustment mechanism further may include a second linear drive motor assembly configured to move the second bracket along the first bracket. The second linear drive motor assembly may include a ball screw driven linear actuator, which is driven by a mechanically coupled motor. For each of the first dispensing unit and the second dispensing unit, the automatic adjustment assembly further may include a Z drive mechanism configured to support and lower the dispensing unit when performing a dispense operation with the first dispensing unit.

Another aspect of the present disclosure is directed to a method of dispensing viscous material on an electronic substrate. In one embodiment, the method comprises: delivering a first electronic substrate pattern to a dispense position; delivering a second electronic substrate pattern to a dispense position; moving first and second dispensing units over the first and second electronic substrate patterns with a gantry configured to move the first and second dispensing units in an X axis direction and a Y axis direction; aligning the first electronic substrate pattern with the first dispensing unit and the second electronic substrate pattern with the second dispensing unit with an automatic adjustment mechanism configured to move the second dispensing unit in the X axis direction and the Y axis direction a predetermined distance from the first dispensing unit; dispensing material from the first dispensing unit at desired locations on the first electronic substrate pattern; and dispensing material from the second dispensing unit at desired locations on the second electronic substrate pattern.

Embodiments of the method further may include calibrating a distance between first and second dispensing units and a camera. Dispensing material from the first dispensing unit at desired locations on the first electronic substrate pattern may include lowering the first dispensing unit toward the first electronic substrate pattern. Dispensing material from the second dispensing unit at desired locations on the second electronic substrate pattern may include lowering the second dispensing unit toward the second electronic substrate pattern. The predetermined distance may be determined by identifying a first point of reference associated with the first electronic substrate pattern and a second point of reference associated with the second electronic substrate pattern. If the at least two patterns are not properly positioned, the method further may include simultaneously performing a first dispense operation on a first pattern of the at least two patterns and performing a second dispense operation on a second pattern of the at least two patterns. Simultaneously performing first and second dispense operations includes dynamically positioning the second dispensing unit with the automatic adjustment mechanism.

The present disclosure will be more fully understood after a review of the following figures, detailed description and claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

Figure 1:
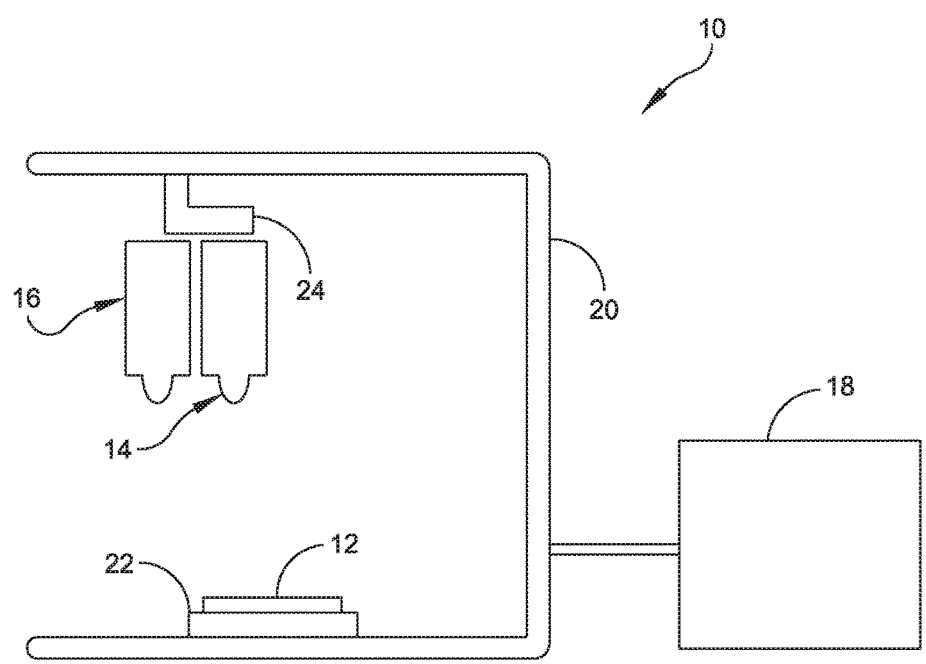
FIG. 1 is a side schematic view of a dispenser of an embodiment of the disclosure.

DETAILED DESCRIPTION OF THE
PREFERRED EMBODIMENTS

For the purposes of illustration only, and not to limit the generality, the disclosure will now be described in detail with reference to the accompanying figures. This disclosure is not limited in its application to the details of construction and the arrangement of components set forth in the following description or illustrated in the drawings. The teachings disclosed herein are capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

As mentioned above, in some cases, multiple independent dispensing systems are sometimes used to increase the production of dispense operations. This solution is often expensive, requiring multiple machines, additional manufacturing space and in some cases multiple machine operators. In typical operations, manufacturing floor space is both limited and expensive. It is therefore desirable to reduce the "footprint" of each manufacturing system on the manufacturing floor and to reduce the number of separate machines that need to be operated and maintained.

For some applications, multiple instances of the same circuit pattern are fabricated on a common substrate. A common example is a circuit pattern for a cell phone, wherein four or more patterns may be disposed on a single substrate. In such cases, there is often a fixed and uniform offset between the multiple instances of the circuit patterns, which may be disposed on a common substrate and separated from one another after completion along perforations. Furthermore, it is known in the industry that a dispensing system with multiple dispensing units or pumps may be utilized to increase throughput. In such systems, the offset distance between the multiple dispensing pumps may be adjusted to be substantially the same as the offset distance between the multiple circuit distances, and if the accuracy of this offset adjustment is within the accuracy requirements of the resultant dispense pattern, then the multiple dispensing pumps can be positioned simultaneously by a single X, Y, Z gantry and operated simultaneously. The present disclosure is directed to a system for automatically adjusting the offset distance between the multiple dispensing pumps.

When a dispensing system is presented with a substrate or component to be dispensed upon, it is typical that an automatic vision system is used to locate and calibrate the actual position of the part and/or critical features within the part. This locating and calibrating allows the system to compensate for variations in either the substrate or component itself or in the fixing of the substrate or component relative to the coordinate system of the dispensing unit positioning system.

When multiple dispensing units or heads are utilized in parallel to achieve a high collective throughput, e.g., dispensing on two substrates at the same time, it is typical that the multiple dispensing units are programmed to perform substantially the same task on substantially identical components. However, because of slight variations in either the components themselves or in the fixing of the components relative to the positioning systems, corrections may need to be applied independently to each of the multiple dispense units. Since these corrections are unique to each of the multiple dispense units, it is necessary that each of the dispensing units be independently positioned relative to its substrate. Accordingly, dispensers configured with multiple dispensing units are more adapted for coarse dispensing applications in which accurate dispensing is not critical.

One prior art system achieves high throughput by utilizing multiple independent dispensing units and is described in U.S. Pat. No. 6,007,631, which is incorporated herein by reference. This dispensing system utilizes multiple independent dispensing units or heads. Each of the multiple dispensing units is mounted on a separate positioning system and operates over an independent work area.

One other prior art system achieves high throughput by utilizing multiple units and multiple pallets of parts and is described in provisional U.S. patent application Ser. No. 60/432,483, filed Dec. 11, 2002, now abandoned, and also in U.S. patent application Ser. No. 10/661,830, filed Sep. 12, 2003, now abandoned, both of which are incorporate herein by reference.

It is desirable to achieve at least some of the throughput advantages of the multiple dispense units or heads while still providing the size and cost advantages of a single dispense system. Embodiments of the disclosure described below achieve the throughput advantages of prior art dispensers described above while further reducing the footprint and cost by positioning multiple dispensing units above the surface of the substrates with a common gantry. Specifically, embodiments of the disclosure are directed to dispensing units, methods of dispensing and dispensing systems that contain methods and apparatus of the disclosure. Embodiments of the disclosure can be used with dispensing system platforms offered under the brand name CAMALOT® by Speedline Technologies, Inc. of Franklin, Mass.

FIG. 1 schematically illustrates a dispenser, generally indicated at 10, used to dispense a viscous material (e.g., adhesive, encapsulent, epoxy, solder paste, underfill material, etc.) or a semi-viscous material (e.g., soldering flux, etc.), or a substantially non-viscous material (e.g., an ink) onto an electronic substrate 12, such as a printed circuit board or semiconductor wafer. The substrate 12 may embody any type of surface or material upon which dispensing is required, and may include any number of patterns. The dispenser 10 includes first and second dispensing units or heads, generally indicated at 14 and 16, respectively, and a controller 18 to control the operation of the dispenser. Although two dispensing units are shown, it should be understood that more than two dispensing units may be provided.

The dispenser 10 also includes a frame 20 having a base 22 for supporting the substrate 12 and a gantry 24 movably coupled to the frame 20 for supporting and moving the dispensing units 14, 16. As is well known in the art of printed circuit board fabrication, a conveyor system (not shown) may be used in the dispenser 10 to control loading and unloading of substrates to and from the dispenser. The gantry 24 can be moved using motors under the control of the controller 18 in the X axis and Y axis directions to position the dispensing units at predetermined locations over the substrate.

Figure 2:
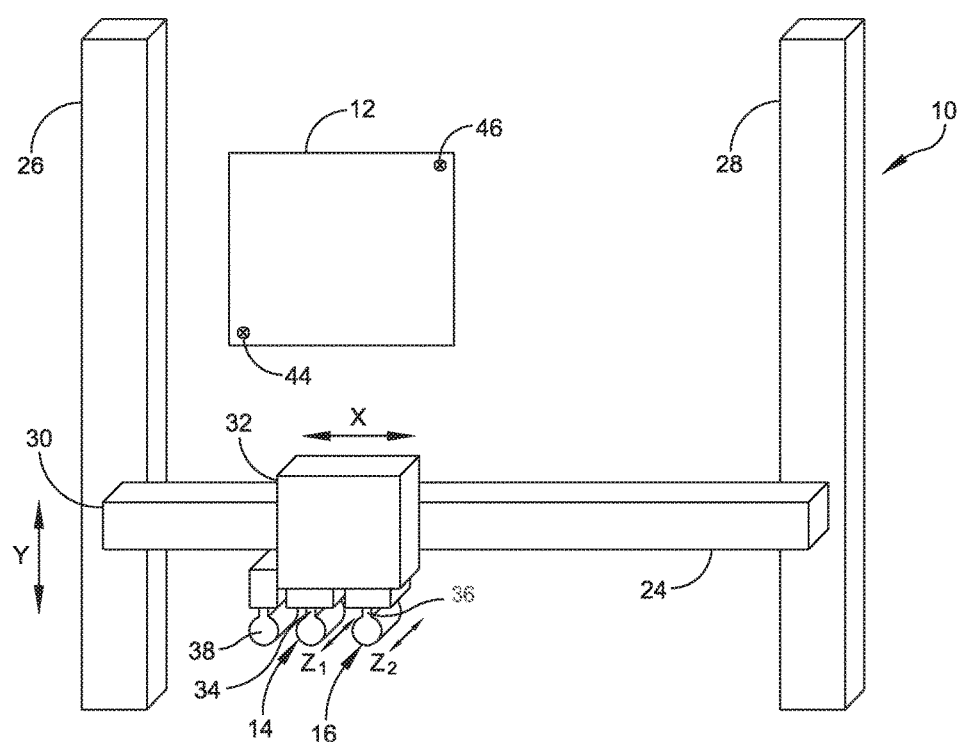
FIG. 2 is a top schematic view of a dispenser of another embodiment.

Referring to FIG. 2, the gantry 24 may be configured to include a left-hand side rail 26, a right-hand side rail 28 and a beam 30 that extends between the two side rails. The beam 30 is configured to move in a Y axis direction along the side rails 26, 28 to achieve Y axis movement of the dispensing units 14, 16. X axis movement of the dispensing units 14, 16 is achieved by a carriage device 32 mounted on the beam 30. Specifically, the carriage device 32 houses the dispensing units 14, 16 and is configured to move along the length of the beam 30 in the X axis direction to move the dispensing units over desired locations of the substrate 12 positioned on the base 22. In a certain embodiment, movement of the gantry 24 (i.e., movement of the beam 30 and the carriage device 32) in the X-Y plane may be achieved by employing ball screw mechanisms driven by respective motors as is well known in the art.

In one embodiment, the platform dispenser 10 described herein may embody an FX-D® dispensing system sold by Speedline Technologies, Inc. of Franklin, Mass. In another embodiment, the platform dispenser may embody a SMARTSTREAM® dispensing system, which is also sold by Speedline Technologies, Inc.

The dispensing units 14, 16, as mentioned above, are capable of achieving Z axis movement by means of independent Z drive mechanisms, which are designated at 34, 36, respectively, in FIG. 2. The amount of Z axis movement may be determined by measuring the distance between the tip of a needle (not shown) of one of the dispensing units 14 and/or 16 and the substrate 12. When moving, one or both of the dispensing units 14, 16 may be positioned at a nominal clearance height above the substrate 12. The clearance height may be maintained at a relatively consistent elevation above the substrate 12 when moving from one dispense location to another dispense location. Upon reaching a predetermined dispense location, the Z drive mechanism 34, 36 lowers its respective dispensing unit 14, 16 to the substrate so that dispensing of material on the substrate 12 may be achieved.

In certain embodiments, a common gantry that moves both of the dispensing units together may control the dispensing units. Thus, a single Z drive mechanism may be provided. This configuration is particularly suited for dispensing units that stream or launch viscous material onto the substrate. In one embodiment, the dispensing unit may be of the type disclosed in U.S. patent application Ser. No. 11/707,620, entitled METHOD AND APPARATUS FOR DISPENSING VISCOUS MATERIAL ON A SUBSTRATE, filed Feb. 16, 2007, which claims priority to U.S. Provisional Patent Application Ser. No. 60/856,508, entitled METHOD AND APPARATUS FOR DISPENSING A VISCOUS MATERIAL ON A SUBSTRATE, filed Nov. 3, 2006, both of which are incorporated herein by reference. With the dispensing unit disclosed in the non-provisional and provisional applications, viscous material streams onto the substrate between predetermined starting and stopping points. In another embodiment, the dispensing unit may be of the type disclosed in U.S. Pat. No. 5,747,102, entitled METHOD AND APPARATUS FOR DISPENSING SMALL AMOUNTS OF LIQUID MATERIAL, issued May 5, 1998, which is incorporated herein by reference. With the dispensing unit disclosed in this patent, viscous material is launched at a predetermined location on the substrate. The dispensing units that stream or launch viscous material may be referred to as non-contact dispensing units in which Z axis movement is not required, but may be provided.

In one embodiment, to measure the height of the needle of the dispensing unit at a desired elevation above the substrate, there is provided a system for measuring the height of the dispenser needle above the substrate in the Z axis direction. In some height (or distance) measuring systems, physical contact is made between the measuring system and the surface. One such height measuring system is described in U.S. Pat. No. 6,093,251, entitled APPARATUS FOR MEASURING THE HEIGHT OF A SUBSTRATE IN A DISPENSING SYSTEM, which is assigned to the assignee of the present disclosure, and is incorporated herein by reference. Specifically, U.S. Pat. No. 6,093,251 discloses a measuring probe that is extendable between a reference point and a location on the substrate to measure the height of the substrate. In other height measuring systems, a laser light source and an optical sensing system are combined to measure the position of an object without making physical contact. An example of a non-contact measuring system is manufactured and distributed by Micro-Epsilon Messtechnik GmbH of Ortenburg, Germany. In other embodiments, the height measuring system can be incorporated to facilitate the measurement of and compensation for variations in the vertical position of the top surface of the substrate.

Still referring to FIG. 2, the dispensing units 14, 16 are moved over the substrate 12 in such a manner to perform a dispense operation with one or both of the dispensing units. However, prior to dispensing, the position of the substrate 12 with respect to the dispensing units 14, 16 is determined so that accurate dispensing may take place. Specifically, the carriage device 32 includes an optical element or camera 38 that is configured to take an image of the substrate 12. Although the camera 38 is shown to be mounted on the carriage device 32, it should be understood that the camera may be separately mounted on the beam 30 or on an independent gantry. The camera 38 may be referred to herein as a "vision system" or an "imaging system." To align the substrate 12 with the dispensing units 14, 16 and gantry 24, images of at least two fiducials (44, 46) are taken by the camera 38. If the substrate 12 is out of position, the gantry 24 may be manipulated to account for the actual position of the substrate. In one embodiment, the camera 38 may be calibrated to determine camera-to-needle offset distances for each of the dispensing units 14, 16 in a manner described in greater detail below.

Figure 3:
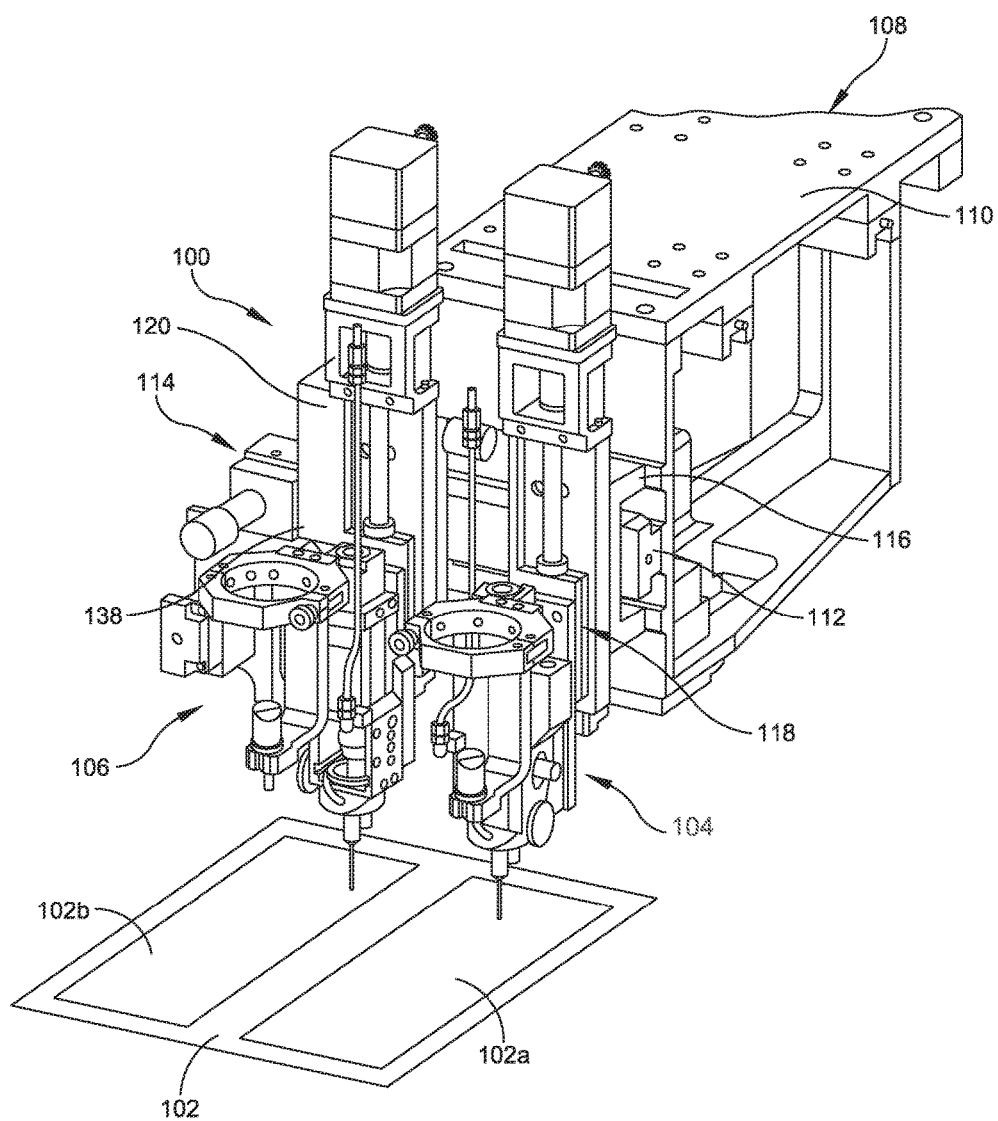
FIG. 3 is a perspective view of a portion of a dispenser of another embodiment of the disclosure.

Referring to FIG. 3, a dispenser is generally indicated at 100. As shown, the dispenser 100 is configured to dispense a viscous material (e.g., adhesive, encapsulent, epoxy, solder paste, underfill material, etc.) or a semi-viscous material (e.g., soldering flux, etc.), or a substantially non-viscous material (e.g., an ink) onto an electronic substrate 102, such as a printed circuit board or semiconductor wafer. The substrate 102 may embody any type of surface or material upon which dispensing is required. As shown, the substrate 102 includes two patterns, indicated at 102a and 102b. The dispenser 100 includes first and second dispensing units or heads, generally indicated at 104 and 106, respectively, which are secured to a gantry, such as gantry 24 of dispenser 10, and operated under the control of a controller, such as controller 18, to control the operation of the dispenser. Although two dispensing units 104, 106 are shown, it should be understood that more than two dispensing units may be provided.

As described above, the dispenser 100 includes a gantry, generally indicated at 108, which is movably coupled to a frame of the dispenser for supporting and moving the dispensing units 104, 106. The construction of gantry 108 is substantially similar to the construction of gantry 24 for dispenser 10. As is well known in the art of printed circuit board fabrication, a conveyor system (not shown) may be used in the dispenser 100 to control loading and unloading of substrates to and from the dispenser. The gantry 108 can be moved using motors under the control of the controller in the X axis and Y axis directions to position the dispensing units 104, 106 at predetermined locations over the substrate 102.

As with gantry 24 of dispenser 10, the gantry may be configured to include a beam that extends between two side rails. The beam is configured to move in a Y axis direction along the side rails to achieve Y axis movement of the dispensing units 104, 106. X axis movement of the dispensing units 104, 106 is achieved by a carriage device 110 mounted on the beam. Specifically, the carriage device 110 supports the dispensing units 104, 106 and is configured to move along a width of the beam in the X axis direction to move the dispensing units over desired locations of the substrate 102 positioned on a base of the dispenser. In a certain embodiment, movement of the gantry 108 (i.e., movement of the beam and the carriage device) in the X-Y plane may be achieved by employing ball screw mechanisms driven by respective motors or other linear motion drive components as is well known in the art.

The first dispensing unit 104 and the second dispensing unit 106 are coupled to the carriage device 110 by a linear bearing 112 secured to the carriage device 110. In one embodiment, the first dispensing unit 104 is fixedly secured to the linear bearing 112 and the second dispensing unit 106 is coupled to the linear bearing by an automatic adjustment mechanism, which is generally indicated at 114 in FIG. 3. It should be understood that the second dispensing unit 106 may be fixed to the linear bearing 112 and the first dispensing unit 104 may be coupled to the automatic adjustment mechanism 114, and fall within the scope of the present disclosure. As shown, the first dispensing unit 104 and the second dispensing unit 106 are offset from one another a distance, with the automatic adjustment mechanism 114 being configured to adjust the distance by moving the second dispensing unit a relatively small distance in the X axis and Y axis directions.

In the shown embodiment, the first dispensing unit 104 is secured to the linear bearing 112 by a mounting assembly having a mounting block 116, which is secured to the first dispensing unit and to the linear bearing. The mounting assembly associated with the first dispensing unit 104 further includes a Z axis movement mechanism, generally indicated at 118, which enables the Z axis movement of the first dispensing unit. The Z axis movement mechanism 118 is particularly suited for lowering the first dispensing unit during a dispensing operation, e.g., for an auger-type dispensing unit.

Figure 4:
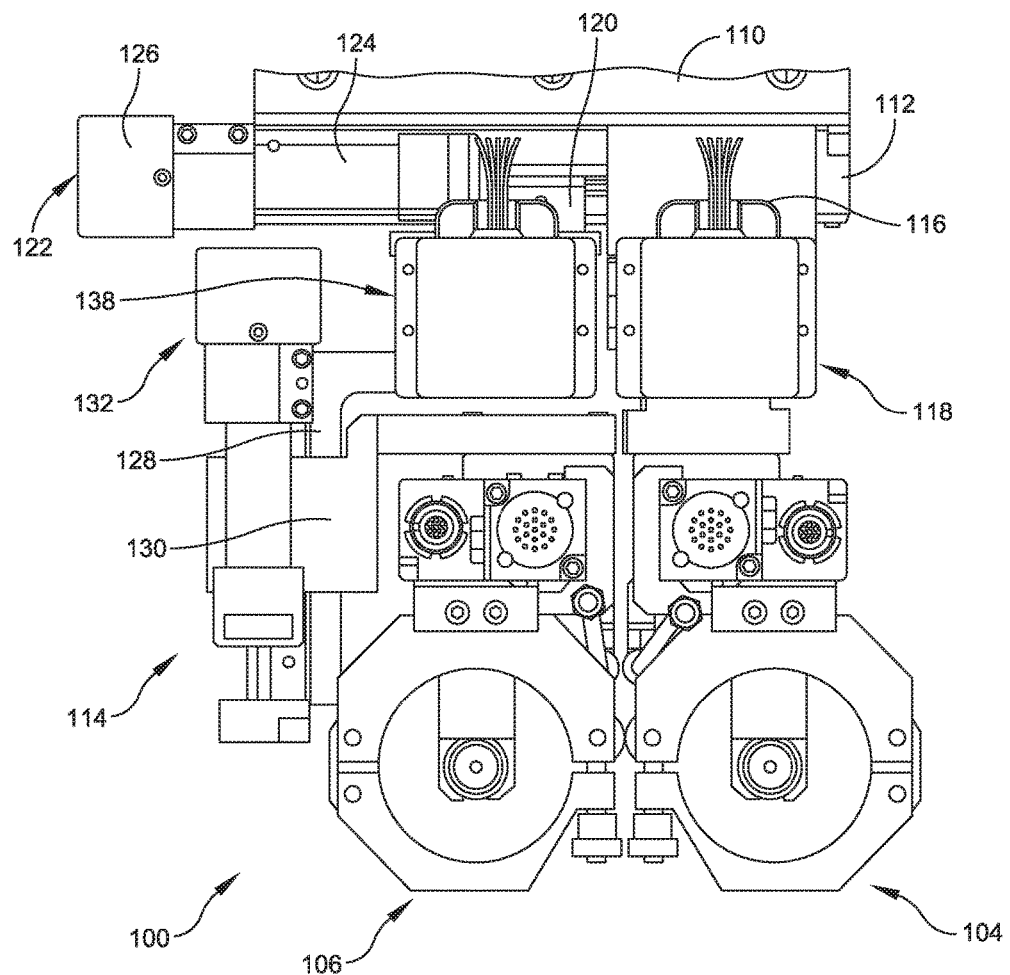
FIG. 4 is an enlarged top plan view of the dispenser shown in FIG. 3.

With additional reference to FIG. 4, the automatic movement mechanism 114 includes a mounting block 120, which is secured to the second dispensing unit 106 and configured to ride along the linear bearing 112 to provide movement in the X axis direction. The automatic adjustment mechanism 114 further includes a first motor assembly generally indicated at 122 configured to move the mounting block 120, and the second dispensing unit 106, along the linear bearing 112. In one embodiment, the first motor assembly 122 includes a ball screw driven linear actuator 124, which is driven by a mechanically coupled rotary servo motor 126 or other electro-mechanical linear drive device. Thus, the automatic adjustment mechanism 114 is capable of adjusting the second dispensing unit 106 in the X axis direction while the first dispensing unit 104 remains stationary. In a certain embodiment, the automatic adjustment mechanism 114 is capable of providing a relatively short amount of X axis movement of the second dispensing unit 106 to provide fine adjustment of the second dispensing unit relative to the first dispensing unit 104.

As mentioned above, the automatic adjustment mechanism 114 is also capable of adjusting the second dispensing unit 106 in the Y axis direction in the manner described below. Specifically, the automatic adjustment mechanism 114 further includes a first bracket 128 secured to the mounting block 120. As shown, the first bracket 128 extends in a direction perpendicular to a direction of the linear bearing 112 in the Y axis direction. The automatic adjustment mechanism 114 further includes a second bracket 130 secured to the second dispensing unit 106 and configured to ride along the first bracket 128 thereby providing a small amount of movement of the second dispensing unit in the Y axis direction. The automatic adjustment mechanism 114 further includes a second motor assembly 132 configured to move the second bracket 130 along the first bracket 128 thereby moving the second dispensing unit 106. In one embodiment, the second motor assembly 132 includes a ball screw driven linear actuator 134, which is driven by a mechanically coupled rotary servo motor 136 or other electro-mechanical linear drive device.

Similar to the first dispensing unit 104, the second dispensing unit 106 includes a Z axis movement mechanism, generally indicated at 138, which enables the Z axis movement of the second dispensing unit. The Z axis movement mechanism 138 is particularly suited for lowering the first dispensing unit during a dispensing operation, e.g., for an auger-type dispensing unit.

As discussed with dispenser 10, the dispenser 100 includes a vision system, such the camera 38 of dispenser 10, and the gantry 108 is capable of moving the camera over the substrate 102 to capture images of the substrate to align the substrate with the dispensing units 104, 106. With the assistance of the camera, the second dispensing unit 106 may be automatically adjusted by the automatic adjustment mechanism 114. Z axis movement of the dispensing units 104, 106 may be achieved by the independent Z drive mechanisms 118, 138 associated with the first and second dispensing units, respectively.

Thus, it should be observed that the dispenser 100 of embodiments of the present disclosure is capable of making automatic positional corrections to multiple dispensing units based on single or multiple vision captures and calculations required adjustments. The dispenser 100 of embodiments of the present disclosure enables higher accuracy in dispensing with multiple dispense units on a single gantry. This enables higher throughput thus greater value to PCB fabricators. With the ever shrinking of electronics and electronics packaging, such PCB fabricators are continuously challenged with greater accuracy requirements from customers with higher throughput. The dispenser 100 of embodiments of the present disclosure addresses these requirements.

In one embodiment, to make a static one-time adjustment per substrate presented to the dispenser, the vision system and the controller locates and calculates the distance of one part in a substrate to another part in the same substrate, as well as any rotation of the substrate relative to the X/Y gantry, and adjust the second dispensing unit one time prior to dispensing simultaneously. In another embodiment, the automatic adjustment mechanism 14 may be utilized to make dynamic adjustments while dispensing separate parts/substrates each indicated at 140 in a carrier, such as an Auer boat 142 shown in FIG. 5, which are not connected or accurately aligned with each other. In this case, the vision system would locate each part/substrate 140 in the carrier 142 and calculate the relative offset and rotation of each part/substrate. The dispenser 100 would then begin dispensing a "master" substrate pattern, while simultaneously dispensing other substrates while dynamically adjusting the other dispensing units relative to the master.

Thus, when two patterns are not properly positioned, or in instances in which two substrates are not properly positioned, the method include simultaneously performing a first dispense operation on the first pattern (or substrate) with the first dispensing unit 104 and performing a second dispense operation on the second pattern (or substrate) with the second dispensing unit 106. This may be achieved by dynamically positioning the second dispensing unit 106 with the automatic adjustment mechanism 114 while continuing to dispense with the first and second dispensing units 104, 106.

Figure 5:
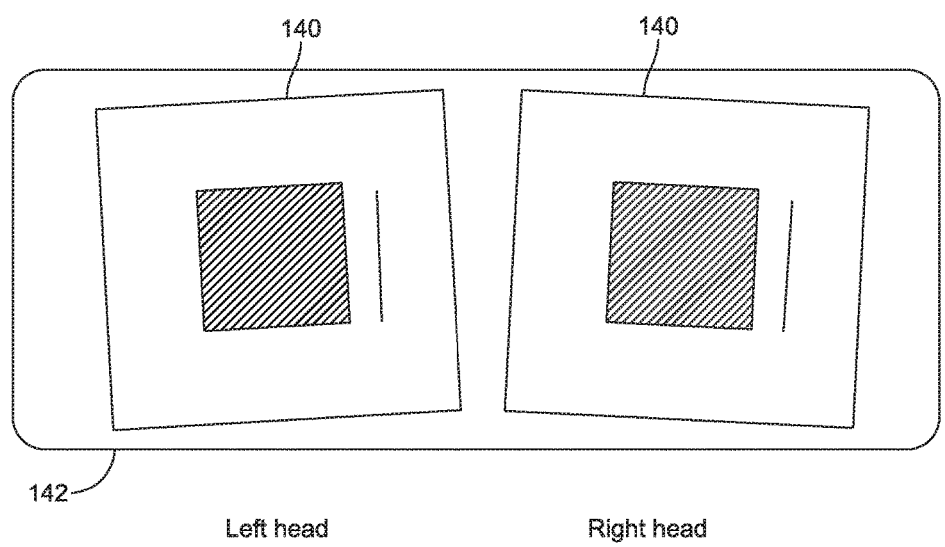
FIG. 5 is a top plan view of two offset parts provided in an Auer boat.

The dispenser 100 of embodiments of the invention is capable of dispensing different patterns simultaneously. In such a method, the gantry 108 carrying the dispensing units 104, 106, as well as the automatic adjustment mechanism 114 associated with the second dispensing unit, are manipulated to dispense different patterns simultaneously. Specifically, for dynamic adjustment, the two parts 140 illustrated in FIG. 5 are offset within the Auer boat 142. The right-hand, first dispensing unit 104 is fixed, so a dispensing path of the first dispensing unit follows the movement of the main gantry 108. A dispensing path of the left-hand, second dispensing unit 106 is calculated from the vision system and controlled by the automatic adjustment mechanism 114. With this method, lines dispensed by the first dispensing unit 104 and the second dispensing unit 106 may be drawn synchronously.

In one embodiment, the automatic adjustment mechanism 114 of the dispenser 100 is capable of moving the second dispensing unit 106 a distance of 50 mm in the X axis direction and a distance of 12 mm in the Y axis direction.

In another embodiment, the dispenser 100 can be configured to enable one or both of the dispensing units 104, 106 to automatically pitch during setup.

Accordingly, for a dispenser having multiple dispensing units, the distance and relative position of each of the multiple dispensing units may be configured to match the distance and relative spacing between each of the multiple substrates or components. After collecting and analyzing alignment information from an automatic vision alignment system, a first of the multiple dispensing units is positioned over a first dispense location on the first substrate or component. After performing a dispense operation, the gantry may be manipulated to make any required X-Y plane position adjustment that may be necessary to align a second of the multiple dispensing units over the corresponding first dispensing location of the second of the multiple substrates or components. Since the distance and relative position between each of the multiple dispense units is substantially similar to, although not necessarily identical to, the distance and relative position between each of the multiple substrates or components, any such adjustment of the gantry will be very small and thus rapidly performed. Each of the remaining multiple dispense units may be similarly utilized to dispense material at the corresponding first dispense location on each of the remaining substrates or components before any large X and Y gantry motion is required. However, if the number of substrates or components is greater than the number of dispense units, then the gantry may need to be repositioned to complete the dispensing operations on all of the substrates. The method is repeated to dispense each of the second and subsequent dispense locations. It should be understood that steps may be interchanged as may be dictated by either throughput or process improvements.

As discussed above, in one embodiment, the dispensing units may be mounted on separate Z drive mechanisms. This configuration enables the performance of independent operations when appropriate, including but not limited to dispensing, cleaning (as by an automatic needle cleaner, for example), purging and calibration (either the X/Y axes position or the Z axis position). However, it should be noted that the dispenser 50 may be particularly suited for non-contact dispensing, such as the streaming of material from the needle. When configured for non-contact dispensing, the dispensing operation may be performed with the two (or more) dispensing units that are mounted on a single Z drive mechanism.

With this particular configuration, in one embodiment, the two dispensing units are both positioned over their respective locations on the two (or more) substrates or a single substrate having two (or more) patterns. Specifically, when positioning the first dispensing unit nearly exactly over a given dispense position on the first substrate, the second dispensing unit is in an approximately correct position over the second substrate. Next, the first dispensing unit performs a first dispense operation on the first substrate. Once completed, the second dispensing unit is moved a minor amount to correct its location over the second substrate so as to enable the performance of a second dispense operation on the second substrate. Since non-contact dispensing does not require a Z axis direction of movement, having the first and second dispensing units mounted on a common Z drive mechanism does not preclude independent dispensing from each of the dispensing units.

As discussed above, when determining the offset distance between multiple substrates, or multiple patterns within a single substrate, the camera may be operated to take images of known reference points, such as fiducials, which are used to determine the offset distance between the substrates. However, the offset distance may be determined by the operator of the dispenser during the set-up of the dispenser based on known configurations. In addition, as described above, the exact offset distance between the substrates is not necessary. A more coarse distance may be appropriate. Specifically, while a more precise offset distance between the substrates would serve to minimize any corrective move required of the second dispensing unit (or the first dispensing unit if the second dispensing unit is fixed), an imprecise offset distance would not preclude or otherwise negatively impact a precise second dispense operation. The actual relative distance between the two or more dispensing units may be measured and therefore corrected for inaccuracies in the setting of the offset distance between the substrates with the automatic adjustment mechanism.

In certain embodiments, when dispensing on multiple patterns provided on a single substrate, each pattern may have its own corresponding set of local alignment fiducials. Alternatively, the substrate may have one set of global fiducials used to align the entire substrate and thus the multiple patterns at once. In a typical process program, the locations of many of the dispensing sites are known, generally being defined relative to the alignment fiducial locations. Accordingly, once the actual locations of the fiducials have been measured using the camera, the actual positions of the many dispense locations may be calculated, including those locations associated with multiple instances of a repeated pattern. Since each of the multiple dispensing units mounted on the gantry has its own camera-to-needle offset distance, which may be separately learned or calibrated as described above, and since each of the multiple dispensing units may be operated at separate times, the proper position corrections for each and every dispense location may be separately and accurately applied to each of the multiple dispensing units.

It should be observed that the dispenser may be operated to perform dispense operations with multiple dispensing units that operate independently from each other. The camera to needle offset distance may be calibrated by the dispenser, or be selected by the operator of the dispenser. Prior to dispensing, the camera-to-needle offset distances may be determined. Additionally, locations of the first and second dispensing units may be calibrated to determine their respective locations prior to dispensing. Finally, the relative offset distance between each of the dispensing units may be nominally (not precisely) calculated to match the relative pitch between multiple instances of a repeated substrate pattern.

Thus, an exemplary dispense operation for two substrates or for two substrate patterns may consist of the following steps: delivering a first electronic substrate pattern to a dispense position; delivering a second electronic substrate pattern to a dispense position; aligning the first electronic substrate pattern with a first dispensing unit; positioning the second dispensing unit a predetermined distance from the first dispensing unit; dispensing material from the first dispensing unit at desired locations on the first electronic substrate pattern; and dispensing material from the second dispensing unit at desired locations on the second electronic substrate pattern. In certain embodiments, the step of dispensing material from the first dispensing unit may comprise lowering the first dispensing unit toward the first electronic substrate pattern. Similarly, the step of dispensing material from the second dispensing unit may comprise lowering the second dispensing unit toward the second electronic substrate pattern.

Another exemplary dispense operation may consist of the following steps: delivering first and second electronic substrate patterns to respective dispense positions; positioning a first dispensing unit over the first electronic substrate pattern; positioning a second dispensing unit a predetermined distance from the first dispensing unit; dispensing material from the first dispensing unit at desired locations on the first electronic substrate pattern, wherein dispensing material from the first dispensing unit comprises lowering the first dispensing unit toward the first electronic substrate pattern; and dispensing material from the second dispensing unit at desired locations on the second electronic substrate pattern, wherein dispensing material from the second dispensing unit comprises, lowering the second dispensing unit toward the second electronic substrate pattern. In certain embodiments, the predetermined distance is determined by identifying a first point of reference associated with the first electronic substrate pattern and a second point of reference associated with the second electronic substrate pattern.

Yet another exemplary dispense operation for two substrates may consist of the following steps: (1) calibrating the actual distance between each of the dispensing units and the camera; (2) identifying the actual positions of the fiducial locations on a substrate or on multiple substrates; (3) moving the first dispensing unit to a first dispense location on a first substrate; (4) dispensing at the first dispense location on the first substrate; (5) moving the second dispensing unit to the first dispense location on the second substrate, which is a small and therefore rapidly performed movement; (6) dispensing at the first dispense location on the second substrate; and (7) repeating steps (3) through (6) for each of the remaining dispense locations on the substrates. The foregoing operation may be performed when dispensing on a single substrate having multiple patterns on the substrate.

In other embodiments of the disclosure, a dual-lane conveyor is incorporated into the system to handle work pieces. In such systems, the dispense units continue to dispense on parts fixed on one conveyor lane while parts are loaded off of and onto another conveyor lane.

In another example, when the substrates are aligned, or in the form of multiple, identical patterns that are aligned with one another on the substrate, such with cell phone patterns, rather than engaging the first dispensing unit to dispense on the first substrate and then the second dispensing unit to dispense on the second substrate, the first and second dispensing units may be operated simultaneously. Thus, with respect to the two substrates, the first and second dispensing units may be moved by the beam and the carriage device over spaced apart locations on the substrate, respectively, to dispense on these locations of respective substrates. After material is dispensed, the beam and the carriage device may operated to move the first and second dispensing units over separate locations, respectively, for performing dispense simultaneous operations on these locations. This process may be repeated for each location until all of the locations on the substrates requiring material are dispensed upon.

As mentioned above, the second dispensing unit may be moved with respect to the first dispensing unit a predetermined distance by the automatic adjustment mechanism, which may be operated to achieve a length that is equivalent to the distance between the first and second substrates. In a certain embodiment, the second dispensing unit may be manually preset to a desired position. Since the patterns on the first and second substrates are identical, the locations on the second substrate correspond to the locations on the first substrate so that the movement of the dispensing units places the dispensing units above corresponding locations on the substrates. Z axis movement may be achieved by the independent Z drive mechanisms associated with the first and second dispensing units, respectively.

In one embodiment, the camera is configured to capture an image of a first pattern (e.g., a fiducial or a pattern landmark on the substrate) and to capture an image of a second pattern (e.g., a fiducial or a pattern landmark on the substrate). The camera may take one or more images of the substrate in order to obtain sufficient information as to whether the first and second patterns are aligned with one another. After taking the image or images, the controller is configured to use the image or images to verify whether the first pattern and the second pattern are properly positioned on the support with respect to one another based on the image. If properly positioned, the dispensing units may be controlled by the controller to perform simultaneous dispense operations of the first dispensing unit on the first pattern and the second dispensing unit on the second pattern. As mentioned above, the dispensing units may be non-contact-type dispensing units that are capable of streaming or launching material onto the substrate.

In the situation where the two patterns are not properly positioned, the dispenser may be operated to accurately dispense material on the patterns. For example, in one embodiment, the first dispensing unit may perform all of the dispense operations on the first pattern. After completing the first pattern, the first dispensing unit or the second dispensing unit may perform all of the dispense operations on the second pattern. In another example, the first dispensing unit may perform some of the dispense operations on a first area of the first pattern. Next, the second dispensing unit may perform some of the dispense operations on a first area of the second pattern. After completing the first areas of the first and second patterns, the first and second dispensing units may sequentially dispense material on subsequent areas of the first and second patterns in the manner described above.

In another embodiment, if the two patterns are not properly positioned, the method may include simultaneously performing a first dispense operation on the first pattern and performing a second dispense operation on the second pattern. This may be achieved by dynamically positioning the second dispensing unit with the automatic adjustment mechanism while continuing to dispense with the first and second dispensing units.

In further examples, the substrate may include three or more patterns, or three or more separate substrates may be provided. With either example, the camera may be configured to capture images of each pattern as described above. After taking the images, the controller may be configured to use the image or images to determine whether the patterns are sufficiently aligned for simultaneous dispensing. In one embodiment, the dispenser may be configured with any number of dispensing units to dispense on the patterns. In other embodiments, the dispenser may be configured with two dispensing units as disclosed above, with one dispensing unit (e.g., dispensing unit 14) dispensing on the first pattern and the other dispensing unit (e.g., dispensing unit 16) simultaneously dispensing on the third pattern. This approach may be particularly desirable when adjacent patterns are positioned too close to one another, thereby prohibiting the dispensing units from being able to operate over adjacent patterns due to the relatively large sizes of the dispensing units. Once dispensing on the first and third patterns is completed, the dispenser may be configured to move the dispensing units such that the first dispensing unit is positioned over the second pattern and the second dispensing unit is positioned over the fourth pattern, if provided. This sequence of operation may continue until dispensing operations are performed on all of the patterns. For an odd number of patterns, the first dispensing unit may be configured to dispense material on the last pattern, while the second dispensing unit remains stationary.

It is further contemplated that when using more than two dispensing units, that this approach of simultaneous dispensing on every other pattern may be employed. For example, when using three dispensing units, the first, third and fifth patterns may be dispensed upon simultaneously by the first, second and third dispensing units, respectively. After dispensing on these patterns, the dispensing units may be moved so that dispensing occurs on the second, fourth and sixth patterns with the first, second and third dispensing units, respectively.

In an exemplary embodiment, a method of dispensing material may include delivering an electronic substrate to a dispense position, the electronic substrate having at least two identical patterns, capturing at least one image of the at least two patterns, determining whether the at least two patterns are properly positioned to perform simultaneous dispense operations on the at least two patterns based on the captured image, and performing simultaneous dispense operations on the at least two patterns if the two patterns are properly positioned.

Dispensing material may include positioning a first dispensing unit over a first location of a first pattern and positioning a second dispensing unit over a first location of a second pattern. As discussed above, the second dispensing unit may be spaced from the first dispensing unit a predetermined distance. Specifically, material may be dispensed from the first and second dispensing units on respective first locations of the first and second patterns. Once dispensing takes place, the first dispensing unit is moved over a second location of the first pattern and the second dispensing unit is simultaneously moved over a second location of the second pattern of the electronic substrate. Once moved, material may be dispensed from the first and second dispensing units on respective second locations of the first and second patterns.

In another exemplary embodiment, a method of dispensing material may include (1) identifying positions of more than one location on an electronic substrate, (2) determining whether a dispense location of a first pattern and a dispense location of a second pattern are properly positioned to perform simultaneous dispense operations on the first and second patterns based on the identified positions, (3) moving a first dispensing unit to a dispense location on the first pattern and a second dispensing unit to a dispense location on the second pattern, the dispense location of the first pattern corresponding with the dispense location on the second pattern, (4) dispensing at the first dispense location on the first pattern with the first dispensing unit and at the first dispense location on the second pattern with the second dispensing unit, and (5) repeating steps (3) and (4) for each remaining dispense location on the first and second patterns of the electronic substrate. As discussed above, prior to performing the method, a distance between the first dispensing unit and the camera and the distance between the second dispensing unit and the camera may be calibrated.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A dispensing apparatus comprising:
    a frame including a gantry configured to provide movement in X axis and Y axis directions, the gantry including a beam configured to move in the Y axis direction to achieve Y axis movement, the gantry further including a carriage mounted on the beam, the carriage being configured to move along the length of the beam in the X axis direction;
    a support coupled to the frame, the support being configured to support at least one electronic substrate under the gantry;
    a first dispenser and a second dispenser coupled to the carriage, the first dispenser and the second dispenser each being configured to dispense material, one of the first dispenser and the second dispenser being coupled to the carriage by an automatic adjustment mechanism;
    an imager coupled to one of the frame and the gantry, the imager being configured to capture at least one image of a first pattern and a second pattern of an electronic substrate, the second pattern being substantially identical to the first pattern; and
    a controller configured to control the operation of the gantry, the first dispenser, the second dispenser, the automatic adjustment mechanism, and the imager,
    wherein the automatic adjustment mechanism is configured to move the one of the first dispenser and the second dispenser in the X axis direction to adjust a spacing between the first dispenser and the second dispenser during a dispensing operation,
    wherein the automatic adjustment mechanism includes a linear bearing secured to the carriage, a mounting block configured to ride along the linear bearing, coupled to the one of the first dispenser and the second dispenser, and a first linear drive motor assembly configured to move the mounting block along the linear bearing,
    wherein the controller is configured to use the at least one image to verify whether the first pattern and the second pattern are properly positioned on the support, and
    wherein if the first pattern and the second pattern are not properly positioned, the controller being configured to control the automatic adjustment mechanism to dynamically position the one of the first dispenser and the second dispenser while continuing the dispense operation.

2. The dispensing apparatus of claim 1, wherein the imager is configured to locate at least a portion of the electronic substrate and the controller is configured to calculate a relative offset and rotation of the at least one portion of the electronic substrate.

3. The dispensing apparatus of claim 2, wherein the controller is configured to calculate the relative offset based on images taken by the imager of known reference points.

4. The dispensing apparatus of claim 1, wherein a relative offset of at least a portion of the electronic substrate is determined during set up of the dispensing apparatus based on known configurations.

5. The dispensing apparatus of claim 1, wherein the dispensing operation comprises having the first dispenser and the second dispenser dispense material on the electronic substrate.

6. The dispensing apparatus of claim 5, further comprising the first dispenser and the second dispenser simultaneously dispensing material on the electronic substrate.

7. The dispensing apparatus of claim 1, wherein the first linear drive motor assembly includes a ball screw driven linear actuator, which is driven by a mechanically coupled motor.

8. The dispensing apparatus of claim 1, wherein the automatic adjustment mechanism is further configured to move the one of the first dispenser and the second dispenser in the Y axis direction, and includes a first bracket secured to the mounting block, the first bracket extending in a direction perpendicular to a direction of the linear bearing, and a second bracket secured to the one of the first dispenser and the second dispenser and configured to ride along the first bracket.

9. The dispensing apparatus of claim 8, wherein the automatic adjustment mechanism further includes a second linear drive motor assembly configured to move the second bracket along the first bracket.

10. The dispensing apparatus of claim 9, wherein the second linear drive motor assembly includes a ball screw driven linear actuator, which is driven by a mechanically coupled motor.

11. The dispensing apparatus of claim 1, wherein, for each of the first dispenser and the second dispenser, a Z drive is configured to lower the dispenser when performing a dispense operation with the dispenser.

* * * * *